(12) United States Patent
Fujita

(10) Patent No.: US 10,562,112 B2
(45) Date of Patent: Feb. 18, 2020

(54) METHOD FOR PROCESSING SPUTTERING TARGET AND METHOD FOR MANUFACTURING SPUTTERING TARGET PRODUCT

(71) Applicant: SUMITOMO CHEMICAL COMPANY, LIMITED, Tokyo (JP)

(72) Inventor: Masahiro Fujita, Niihama (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 0 days.

(21) Appl. No.: 16/083,381

(22) PCT Filed: Feb. 9, 2018

(86) PCT No.: PCT/JP2018/004578
§ 371 (c)(1),
(2) Date: Sep. 7, 2018

(87) PCT Pub. No.: WO2018/151036
PCT Pub. Date: Aug. 23, 2018

(65) Prior Publication Data
US 2019/0099814 A1    Apr. 4, 2019

(30) Foreign Application Priority Data

Feb. 16, 2017    (JP) .................................. 2017-027094

(51) Int. Cl.
*B23C 3/12*    (2006.01)
*C23C 14/34*    (2006.01)
*C23C 14/14*    (2006.01)

(52) U.S. Cl.
CPC ................. *B23C 3/12* (2013.01); *C23C 14/14* (2013.01); *C23C 14/3414* (2013.01)

(58) Field of Classification Search
CPC .......... B23B 5/16; B23B 5/166; B23B 5/167; B23B 5/168; B23B 51/00; B23B 51/10;
(Continued)

(56) References Cited

U.S. PATENT DOCUMENTS 3,232,145 A * 2/1966 Wilson .................... B23B 5/167
                                              408/202
4,243,348 A * 1/1981 Paige ...................... B23C 3/126
                                              407/107
(Continued)

FOREIGN PATENT DOCUMENTS

CN      201380292 Y    1/2010
JP      52-84591       6/1977
(Continued)

OTHER PUBLICATIONS

International Search Report for PCT/JP2018/004578 (PCT/ISA/210) dated May 15, 2018.
(Continued)

*Primary Examiner* — Nicole N Ramos
(74) *Attorney, Agent, or Firm* — Birch, Stewart, Kolasch & Birch, LLP

(57) ABSTRACT

Disclosed is a method for processing a sputtering target comprises: processing a sputtering target by rotating a cutting tool which has a blade portion with an arc-shaped concave curved surface on a cross section along the axis, around an axis thereof, to chamfer the target at a corner portion between a sputtering surface and a side surface in the sputtering target with an arc-shaped concave curved surface of a blade portion in such a manner that the corner portion is approximated to an arc-shaped aimed R face, wherein the sputtering target is chamfered at the corner portion in such a manner that a curvature radius Ra of the concave curved surface in the blade portion is equal to or more than a curvature radius Rb of the aimed R face on the cross section (Continued)

along the axis and that both ends of the concave curved surface in the blade portion are positioned away from the sputtering target.

4 Claims, 9 Drawing Sheets

(58) Field of Classification Search
CPC ... B23B 51/103; B23B 27/00; B23B 2270/30; B23B 2215/72; B23B 2220/04; B23B 2220/08; B23C 3/12
See application file for complete search history.

(56) References Cited

U.S. PATENT DOCUMENTS

| | | | | |
|---|---|---|---|---|
| 4,580,932 | A * | 4/1986 | Depperman | B23B 51/105 407/9 |
| 4,750,849 | A | 6/1988 | Phillips | |
| 4,966,504 | A * | 10/1990 | Seme, Jr. | B23B 5/166 30/375 |
| 7,044,694 | B2 * | 5/2006 | Lowder | B23C 3/12 144/136.95 |
| 8,920,218 | B2 * | 12/2014 | Moision | B23K 35/40 451/443 |
| 8,979,439 | B2 * | 3/2015 | Fahnenstich | A61F 9/00772 407/30 |
| 2011/0240467 | A1 | 10/2011 | Itoh et al. | |
| 2012/0093593 | A1 * | 4/2012 | Lutz | B23B 5/166 407/30 |
| 2014/0069245 | A1 | 3/2014 | Tan et al. | |
| 2016/0199917 | A1 * | 7/2016 | Wepfer | B23B 5/168 82/1.11 |

FOREIGN PATENT DOCUMENTS

| | | |
|---|---|---|
| JP | 53-157489 | 12/1978 |
| JP | S63-174810 A | 7/1988 |
| JP | 5-187371 A | 7/1993 |
| JP | 6-39634 A | 2/1994 |
| JP | 6-248444 A | 9/1994 |
| JP | H08-141893 A | 6/1996 |
| JP | 8-257835 A | 10/1996 |
| JP | 10-337607 A | 12/1998 |
| JP | 2001-040471 A | 2/2001 |
| JP | 2002-283117 A | 10/2002 |
| JP | 2007-070715 A | 3/2007 |
| JP | 2009-127125 A | 6/2009 |
| JP | 9-216111 A | 1/2010 |
| JP | 2010-100930 A | 5/2010 |
| JP | 2011-149034 A | 8/2011 |
| JP | 2011-200958 A | 10/2011 |
| JP | 2015-191827 A | 11/2015 |
| WO | WO 2009/069658 A1 | 6/2009 |

OTHER PUBLICATIONS

Japanese Decision to Grant a Patent (including an English translation thereof) issued in the corresponding Japanese Patent Application No. 2017-027094 dated Dec. 19, 2017.
Japanese Decision to Grant a Patent (including an English translation thereof) issued in the corresponding Japanese Patent Application No. 2018-001834 dated May 8, 2018.
Chinese First Office Action (including an English translation thereof) issued in the corresponding Chinese Patent Application No. 201880001274.9 dated Feb. 26, 2109.
Chinese Second Office Action (including an English translation thereof) issued in the corresponding Chinese Patent Application No. 201880001274.9 dated Jun. 27, 2109.
Korean Notice of Final Rejection (including an English translation thereof) issued in the corresponding Korean Patent Application No. 10-2018-7026220 dated Mar. 13, 2019.
Korean Notice of Final Rejection (including an English translation thereof) issued in the corresponding Korean Patent Application No. 10-2018-7026220 dated May 1, 2019.
Korean Notice of Reason for Refusal (including an English translation thereof) issued in the corresponding Korean Patent Application No. 10-2018-7026220 dated Dec. 3, 2018.

* cited by examiner

FIG. 6

| L[mm] \ Ra | b=0 | 0.1 | 0.2 | 0.3 | 0.4 | 0.5 |
|---|---|---|---|---|---|---|
| 3 | 3.0 | 2.1 | 1.7 | 1.4 | 1.1 | 0.8 |
| 3.25 | 3.0 | 2.3 | 1.9 | 1.6 | 1.3 | 1.0 |
| 3.5 | 3.0 | 2.4 | 2.0 | 1.7 | 1.4 | 1.1 |
| 3.75 | 3.0 | 2.5 | 2.1 | 1.8 | 1.5 | 1.2 |
| 4 | 3.0 | 2.5 | 2.2 | 1.9 | 1.6 | 1.3 |
| 4.25 | 3.0 | 2.6 | 2.2 | 1.9 | 1.6 | 1.4 |
| 4.5 | 3.0 | 2.6 | 2.3 | 2.0 | 1.7 | 1.4 |

FIG. 7

| θ[rad] \ Ra | b=0 | 0.1 | 0.2 | 0.3 | 0.4 | 0.5 |
|---|---|---|---|---|---|---|
| 3 | 0.00 | 0.26 | 0.37 | 0.45 | 0.52 | 0.59 |
| 3.25 | 0.07 | 0.26 | 0.36 | 0.44 | 0.51 | 0.57 |
| 3.5 | 0.13 | 0.27 | 0.37 | 0.44 | 0.50 | 0.56 |
| 3.75 | 0.18 | 0.30 | 0.38 | 0.44 | 0.50 | 0.56 |
| 4 | 0.23 | 0.32 | 0.39 | 0.45 | 0.51 | 0.56 |
| 4.25 | 0.26 | 0.34 | 0.41 | 0.46 | 0.51 | 0.56 |
| 4.5 | 0.29 | 0.36 | 0.42 | 0.47 | 0.52 | 0.56 |

FIG. 8

| d[mm] \ b | 0 | 0.1 | 0.2 | 0.3 | 0.4 | 0.5 |
|---|---|---|---|---|---|---|
| 3 | 0.00 | 0.10 | 0.20 | 0.30 | 0.40 | 0.50 |
| 3.25 | 0.01 | 0.11 | 0.21 | 0.31 | 0.41 | 0.51 |
| 3.5 | 0.03 | 0.13 | 0.23 | 0.33 | 0.43 | 0.53 |
| 3.75 | 0.06 | 0.16 | 0.26 | 0.36 | 0.46 | 0.56 |
| 4 | 0.10 | 0.20 | 0.30 | 0.40 | 0.50 | 0.60 |
| 4.25 | 0.15 | 0.25 | 0.35 | 0.45 | 0.55 | 0.65 |
| 4.5 | 0.19 | 0.29 | 0.39 | 0.49 | 0.59 | 0.69 |

FIG. 9

| L[mm] \ b | 0 | 0.1 | 0.2 | 0.3 | 0.4 | 0.5 |
|---|---|---|---|---|---|---|
| 2 | 2.0 | 1.3 | 0.9 | 0.6 | 0.4 | 0.2 |
| 2.25 | 2.0 | 1.4 | 1.1 | 0.8 | 0.5 | 0.3 |
| 2.5 | 2.0 | 1.5 | 1.2 | 0.9 | 0.6 | 0.4 |
| 2.75 | 2.0 | 1.6 | 1.3 | 1.0 | 0.7 | 0.5 |
| 3 | 2.0 | 1.6 | 1.3 | 1.0 | 0.8 | 0.5 |
| 3.25 | 2.0 | 1.6 | 1.3 | 1.1 | 0.8 | 0.6 |
| 3.5 | 2.0 | 1.7 | 1.4 | 1.1 | 0.9 | 0.6 |

(Ra on vertical axis)

FIG. 10

| θ[rad] \ b | 0 | 0.1 | 0.2 | 0.3 | 0.4 | 0.5 |
|---|---|---|---|---|---|---|
| 2 | 0.00 | 0.32 | 0.45 | 0.55 | 0.64 | 0.72 |
| 2.25 | 0.11 | 0.32 | 0.44 | 0.53 | 0.62 | 0.69 |
| 2.5 | 0.18 | 0.34 | 0.44 | 0.53 | 0.60 | 0.67 |
| 2.75 | 0.24 | 0.37 | 0.46 | 0.53 | 0.60 | 0.66 |
| 3 | 0.29 | 0.39 | 0.47 | 0.54 | 0.60 | 0.66 |
| 3.25 | 0.34 | 0.42 | 0.49 | 0.55 | 0.61 | 0.66 |
| 3.5 | 0.37 | 0.44 | 0.50 | 0.56 | 0.61 | 0.66 |

(Ra on vertical axis)

FIG. 11

| d[mm] | b=0 | b=0.1 | b=0.2 | b=0.3 | b=0.4 | b=0.5 |
|---|---|---|---|---|---|---|
| 2 | 0.00 | 0.10 | 0.20 | 0.30 | 0.40 | 0.50 |
| 2.25 | 0.01 | 0.11 | 0.21 | 0.31 | 0.41 | 0.51 |
| 2.5 | 0.04 | 0.14 | 0.24 | 0.34 | 0.44 | 0.54 |
| 2.75 | 0.08 | 0.18 | 0.28 | 0.38 | 0.48 | 0.58 |
| 3 | 0.13 | 0.23 | 0.33 | 0.43 | 0.53 | 0.63 |
| 3.25 | 0.18 | 0.28 | 0.38 | 0.48 | 0.58 | 0.68 |
| 3.5 | 0.24 | 0.34 | 0.44 | 0.54 | 0.64 | 0.74 |

FIG. 12

| L[mm] \ b | 0 | 0.1 | 0.2 | 0.3 | 0.4 | 0.5 |
|---|---|---|---|---|---|---|
| 4 | 4.0 | 3.0 | 2.6 | 2.2 | 1.9 | 1.6 |
| 4.25 | 4.0 | 3.2 | 2.7 | 2.4 | 2.0 | 1.7 |
| 4.5 | 4.0 | 3.3 | 2.9 | 2.5 | 2.2 | 1.9 |
| 4.75 | 4.0 | 3.4 | 3.0 | 2.6 | 2.3 | 2.0 |
| 5 | 4.0 | 3.5 | 3.1 | 2.7 | 2.4 | 2.1 |
| 5.25 | 4.0 | 3.5 | 3.1 | 2.8 | 2.4 | 2.1 |
| 5.5 | 4.0 | 3.5 | 3.2 | 2.8 | 2.5 | 2.2 |

(Row label: $R_a$)

FIG. 13

| θ[rad] \ b | 0 | 0.1 | 0.2 | 0.3 | 0.4 | 0.5 |
|---|---|---|---|---|---|---|
| 4 | 0.00 | 0.22 | 0.32 | 0.39 | 0.45 | 0.51 |
| 4.25 | 0.06 | 0.22 | 0.31 | 0.38 | 0.44 | 0.49 |
| 4.5 | 0.11 | 0.24 | 0.32 | 0.38 | 0.44 | 0.49 |
| 4.75 | 0.15 | 0.25 | 0.33 | 0.39 | 0.44 | 0.49 |
| 5 | 0.18 | 0.27 | 0.34 | 0.39 | 0.44 | 0.49 |
| 5.25 | 0.22 | 0.29 | 0.35 | 0.40 | 0.45 | 0.49 |
| 5.5 | 0.25 | 0.31 | 0.37 | 0.41 | 0.46 | 0.50 |

(Row label: $R_a$)

FIG. 14

| d[mm] \ b | 0 | 0.1 | 0.2 | 0.3 | 0.4 | 0.5 |
|---|---|---|---|---|---|---|
| 4 | 0.00 | 0.10 | 0.20 | 0.30 | 0.40 | 0.50 |
| 4.25 | 0.01 | 0.11 | 0.21 | 0.31 | 0.41 | 0.51 |
| 4.5 | 0.03 | 0.13 | 0.23 | 0.33 | 0.43 | 0.53 |
| 4.75 | 0.05 | 0.15 | 0.25 | 0.35 | 0.45 | 0.55 |
| 5 | 0.09 | 0.19 | 0.29 | 0.39 | 0.49 | 0.59 |
| 5.25 | 0.12 | 0.22 | 0.32 | 0.42 | 0.52 | 0.62 |
| 5.5 | 0.17 | 0.27 | 0.37 | 0.47 | 0.57 | 0.67 |

Ra

METHOD FOR PROCESSING SPUTTERING TARGET AND METHOD FOR MANUFACTURING SPUTTERING TARGET PRODUCT

TECHNICAL FIELD

The present invention relates to a method for processing a sputtering target and a method for producing a sputtering target product.

BACKGROUND ART

With regard to a sputtering target, there has been proposed a processing method in which a corner portion between a sputtering surface and a side surface in the sputtering target is chamfered to form an R face by machining (see Patent Document 1).

PRIOR ART DOCUMENT

Patent Document

Patent Document 1: JP 2001-40471 A

DISCLOSURE OF THE INVENTION

Problems to be Solved by the Invention

It is an object of the present invention to provide a method for processing a sputtering target and a method for producing a sputtering target product both of which method can make an R face approximated to an aimed R face.

Means for Solving the Problems

A method for processing a sputtering target according to the present invention comprises:

processing a sputtering target by rotating a cutting tool which has a blade portion with an arc-shaped concave curved surface on a cross section along the axis, around an axis thereof, to chamfer the target at a corner portion between a sputtering surface and a side surface in the sputtering target, with the arc-shaped concave curved surface of the blade portion in such a manner that the corner portion gets approximated to an arc-shaped aimed R face, wherein the sputtering target is chamfered at the corner portion in such a manner that a curvature radius Ra of the concave curved surface in the blade portion is equal to or more than a curvature radius Rb of the aimed R face on the cross section along the axis and that both ends of the concave curved surface in the blade portion are positioned away from the sputtering target.

According to a method for processing a sputtering target in accordance with the present invention, the sputtering target is chamfered at the corner portion in such a manner that a curvature radius Ra of the concave curved surface in the blade portion is equal to or more than a curvature radius Rb of the aimed R face on the cross section along the axis and that both ends of the concave curved surface in the blade portion are positioned away from the sputtering target.

It can make an R face approximated to an arc-shaped aimed R face and prevent the face from being scratched when cutting a sputtering target at a corner portion with an arc-shaped concave curved surface of a blade portion.

A method for processing a sputtering target according to the present invention also includes processing a disc-shaped or cylindrical sputtering target by rotating the target around the central axis thereof to chamfer the target at a corner portion between a sputtering surface and a side surface in the rotating sputtering target with an arc-shaped concave curved surface of a blade portion in such a manner that the corner portion gets approximated to an arc-shaped aimed R face, wherein the sputtering target is chamfered at the corner portion in such a manner that a curvature radius Ra of the concave curved surface in the blade portion is equal to or more than a curvature radius Rb of the aimed R face on the cross section along the axis and both ends of the concave curved surface in the blade portion are positioned away from the sputtering target.

According to the method for processing a sputtering target in accordance with the present invention, a disc-shaped or cylindrical sputtering target is rotated around the central axis to being chamfered at its corner portion in such a manner that a curvature radius Ra of the concave curved surface in the blade portion is equal to or more than a curvature radius Rb of the aimed R face on the cross section along the axis and that both ends of the concave curved surface in the blade portion are positioned away from the sputtering target.

It can make a disc-shaped or cylindrical sputtering target chamfered at its corner portion efficiently and prevent the face from being scratched when cutting a sputtering target at a corner portion with an arc-shaped concave curved surface of a blade portion.

In this method, a curvature radius Ra of the concave curved surface in the blade portion is more than a curvature radius Rb of the aimed R face on the cross section along the axis so that preventing an R face from being scratched can efficiently be realized.

In an embodiment of the method for processing a sputtering target, the sputtering target is chamfered at the corner portion in such a manner that both the ends of the concave curved surface in the blade portion are positioned away from the sputtering target, and that, in a coordinate system in which a center point Cb of the aimed R face is set as an origin, a [mm] is a gap of a first center point C1 of the concave curved surface with the curvature radius Ra of the blade portion from the center point Cb of the aimed R face in each of horizontal and vertical directions on the coordinate system, Ra, Rb, and a are set to satisfy the following conditions:

with regard to an intercept L [mm] of an R face, the relationship of $Rb/2 \leq L \leq Rb$ is satisfied when L is represented by the formula of $L=Rb-Ra\{1-(Rb-a)^2/Ra^2\}^{1/2}-a$;

with regard to an angle θ [rad] formed between the sputtering surface of the sputtering target and an end portion of the R face of the sputtering target, the relationship of $0 \leq \theta \leq \pi/6$ is satisfied when the angle θ [rad] is represented by the formula of $\theta=\pi/2-\cos^{-1}\{1-(Rb-a)^2/Ra^2\}^{1/2}$; and with regard to a distance d [mm] between an end portion of the concave curved surface in the blade portion and the sputtering surface of the sputtering target, the relationship of $0.05 \leq d$ is satisfied when the distance d [mm] is represented by the formula of $d=Ra-Rb+a$.

Here, the value "a" is a negative value when Cb is set as the origin and C1 is located more on the inner side of the sputtering target than Cb, and a positive value when C1 is located more on the outer side of the sputtering target than the origin Cb.

According to the embodiment, the following relationships are satisfied: $Rb/2 \leq L \leq Rb$, $0 \leq \theta \pi/6$, and $0.05 \leq d$. Accordingly, the R face can further be approximated to the aimed R face and prevented from being scratched.

A method for producing a sputtering target product includes a step of processing a sputtering target using the method for processing a sputtering target.

According to the embodiment, the sputtering target product is produced by the above method for processing a sputtering target so that a sputtering target product with fewer scratches to the R face can be provided.

Effects of the Invention

According to the present invention, when the sputtering target is cut to be chamfered at a corner portion thereof with a concave curved surface of a blade portion to form an R face, the R face can be approximated to an aimed R face and be prevented from being scratched.

BRIEF DESCRIPTION OF THE DRAWINGS

FIG. 6 shows the relationship between Ra and b and the intercept L.

FIG. 7 shows the relationship between Ra and b and the angle θ of the R face.

FIG. 8 shows the relationship between Ra and b and the gap d.

FIG. 9 shows the relationship between Ra and b and the intercept L.

FIG. 10 shows the relationship between Ra and b and the angle θ of the R face.

FIG. 11 shows the relationship between Ra and b and the gap d.

FIG. 12 shows the relationship between Ra and b and the intercept L.

FIG. 13 shows the relationship between Ra and b and the angle θ of the R face.

FIG. 14 shows the relationship between Ra and b and the gap d.

MODE FOR CARRYING OUT THE INVENTION

Embodiments of the invention will be described in detail below with reference to the accompanying drawings.

First Embodiment

Figure 1:
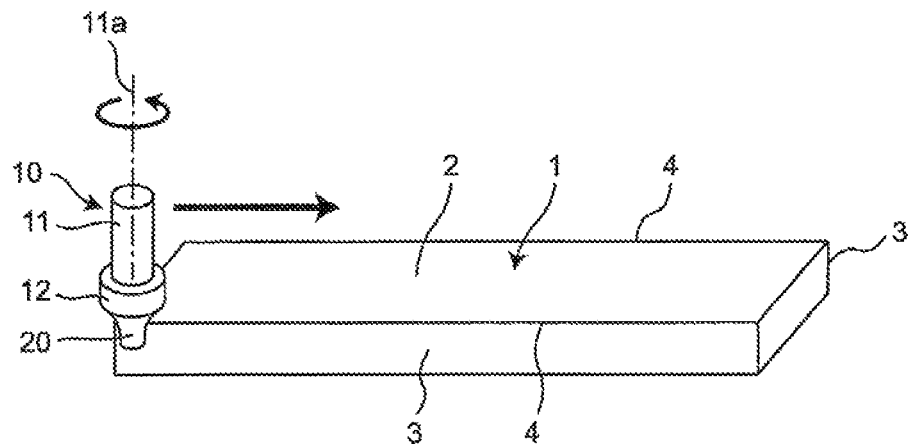
FIG. 1 is a perspective view illustrating a first embodiment of a method for processing a sputtering target according to the present invention.
Figure 2:
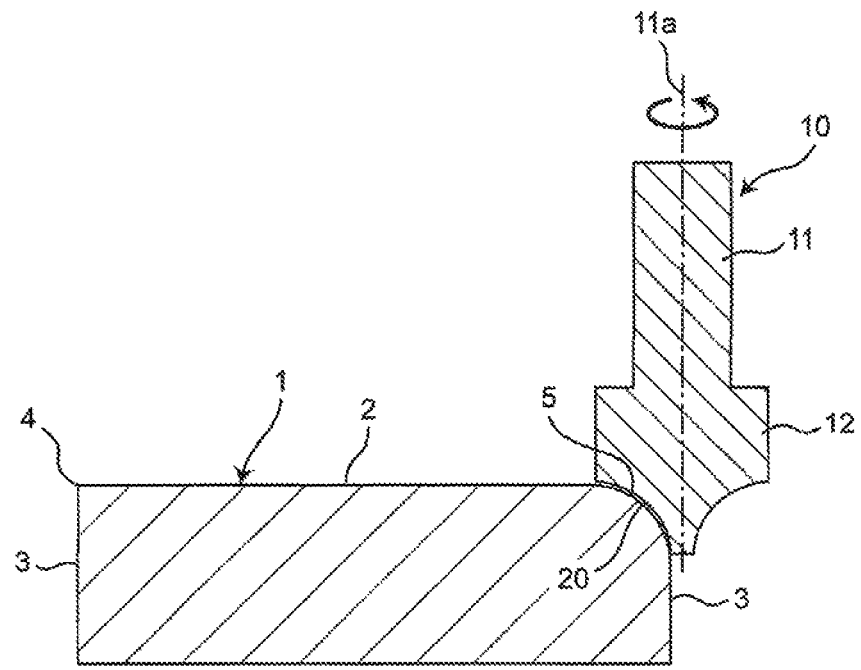
FIG. 2 is a cross-sectional view illustrating the first embodiment of the method for processing a sputtering target.

FIG. 1 is a perspective view illustrating a first embodiment of a processing method according to the present invention. FIG. 2 is a cross-sectional view illustrating an embodiment of the processing method according to the present invention. As illustrated in FIGS. 1 and 2, in the method for processing a sputtering target, a sputtering target 1 is chamfered at a corner portion 4 formed between a sputtering surface 2 and a side surface 3 into an R face 5 using a cutting tool 10.

The sputtering target 1 is formed in an elongated plate shape. The sputtering surface 2 is constituted of an upper surface defined by a short side direction and a long side direction. The side surface 3 is constituted of a surface defined by the sputtering surface 2 and the thickness direction of the sputtering target. Each corner portion 4 is constituted of a side defined by the sputtering surface 2 and the side surface 3. The sputtering target 1 may be formed in a disk shape. In this case, the sputtering surface 2 is constituted of a circular upper surface, and the side surface 3 is constituted of a circumferential surface between the circular upper surface and the circular lower surface.

The sputtering surface 2 of the sputtering target 1 receives inert gas that has been plasmatized (or ionized) by sputtering. When inert gas particles collide with the sputtering surface 2 of the sputtering target 1, target atoms contained in the sputtering target 1 are sputtered and ejected from the sputtering surface 2. The sputtered atoms are deposited on a substrate facing the sputtering surface 2 to thereby form a thin film on the substrate.

The sputtering target 1 can be made of a material selected from the group consisting of metals, such as aluminum (Al), copper (Cu), chromium (Cr), iron (Fe), tantalum (Ta), titanium (Ti), zirconium (Zr), tungsten (W), molybdenum (Mo), niobium (Nb), indium (In), and alloys thereof. However, the material constituting the sputtering target 1 is not limited thereto.

The material constituting the sputtering target 1 for an electrode or a wiring material is preferably Al, more preferably Al having a purity of 99.99% or more, and still more preferably Al having a purity of 99.999% or more. The high-purity Al is suitable as the material of the target material 1 for an electrode or a wiring material because of its high electrical conductivity. As Al becomes higher in purity, Al materials become softer to easily deform the Al material. Therefore, a method according to the present invention can be suitable for producing the target material with the high-purity Al.

Examples of the cutting tool 10 include an end mill, a radius cutter, an R cutter, and the like, and in a processing device where the cutting tool 10 is installed, with the sputtering target 1 fixed, the corner portion of the sputtering target 1 is chamfered by moving the rotating cutting tool 10. Examples of this type of processing device include milling machines, NC milling machines, machining centers, and the like.

The cutting tool 10 includes a shaft portion 11 rotatable around an axis 11a and a blade portion 12 provided at a leading end of the shaft portion 11. The central axis of the blade portion 12 coincides with the axis 11a of the shaft portion 11. Two or three blade portions 12 may be present around the axis 11a independently from each other. Alternatively, the blade portions 12 may be continuously present around the axis 11a. Alternatively, the blade portion 12 may be formed integrally with the shaft portion 11 or may be formed as a replaceable chip. The cutting tool 10 is arranged with respect to the sputtering target 1 such that the axis 11a coincides with the thickness direction of the sputtering target 1. Then, the cutting tool 10 is moved in the circumferential direction (the extending direction of the corner portion 4) of the sputtering surface 2 of the sputtering target 1 while rotating around the axis 11a, whereby the blade portion 12 of the cutting tool 10 sequentially cuts the corner portion 4 of the sputtering target 1. Thereby, the corner portion 4 is chamfered into the R face 5 as the processed surface.

Figure 3:
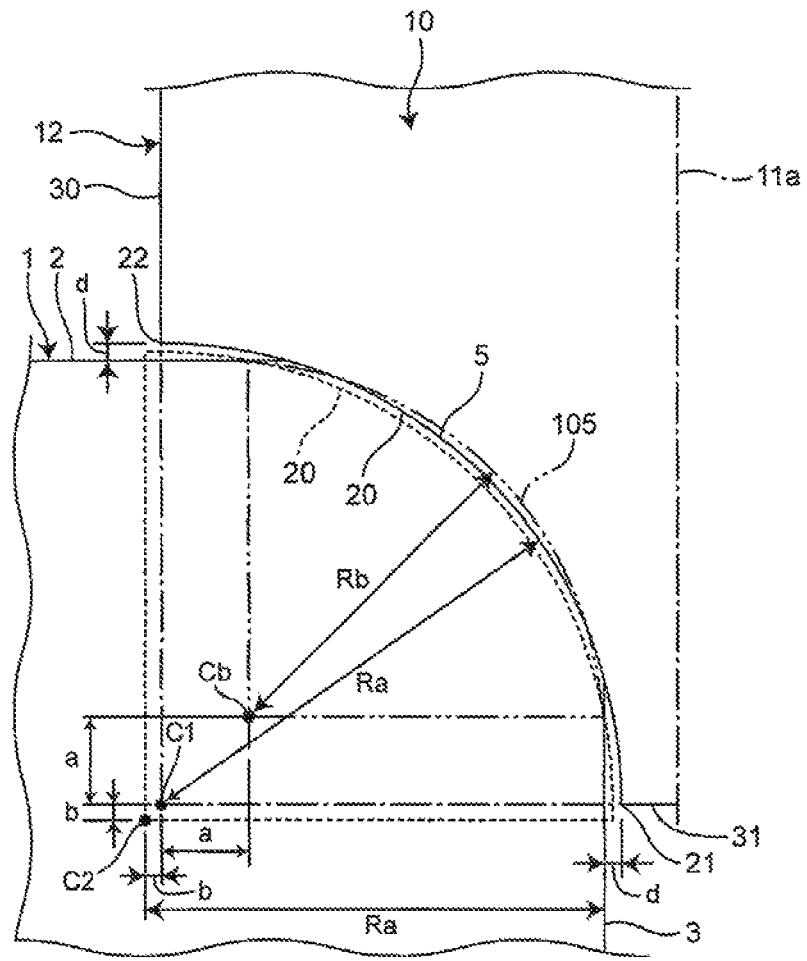
FIG. 3 is an enlarged cross-sectional view of FIG. 2.

FIG. 3 is an enlarged cross-sectional view of FIG. 2. As shown in FIG. 3, an outer circumferential surface of the blade portion 12 includes an arc-shaped concave curved surface 20 that extends from the trailing end to leading end of the blade portion 12 on its cross section along the axis 11a. The concave curved surface 20 is formed with the axis 11a positioned as the central axis. Two or three concave curved surfaces 20 may be present independently from each other or continuously present. Alternatively, the blade portion 12 may be formed integrally with the shaft portion 11 or may be formed as a replaceable chip. The concave curved surface 20 is an arc surface of a quarter (¼) of an exact circle. The concave curved surface 20 includes a first end 21 on the leading end side and a second end 22 on the trailing end side. The leading end side refers to the side of the concave curved surface 20 where the sputtering target 1 is processed at the side surface 3, whereas the trailing end side refers to the side of the concave curved surface 20 where he sputtering target 1 is processed at the sputtering surface 2.

Furthermore, the outer circumferential surface of the blade portion 12 includes a side surface 30 extending in parallel to the axis 11a. The blade portion 12 includes a leading end surface 31 that intersects the axis 11a. The first end 21 of the concave curved surface 20 is connected to the leading end surface 31. The second end 22 of the concave curved surface 20 is connected to the side surface 30.

The number of blades installed around the axis 11a is preferably two to four. As the applicable processing conditions, the rotational speed of the blade portion 12 is preferably 100 to 10,000 rpm, and the tool feed speed is preferably 100 to 3,000 mm/min.

Next, a method for processing a sputtering target 1 will be described.

As shown in FIG. 3, a sputtering target 1 is processed by rotating a cutting tool 10 around the axis 11a, cutting the sputtering target 1 at a corner portion with a concave curved surface 20 of a blade portion 12 to be chamfered so as to be approximated an aimed R face 105 having an arc shape, thereby forming an R face 5 in the sputtering target 1.

Here, the aimed R face 105 is indicated by a two-dot chain line in FIG. 3. A curvature radius Rb of the aimed R face 105 is a predetermined value.

Here, the sputtering target 1 is chamfered at the corner portion in such a manner that a curvature radius Ra of the concave curved surface 20 of the blade portion 12 is equal to or more than the curvature radius Rb of the aimed R face 105, and preferably more than the curvature radius Rb on the cross section along the axis 11a, the end portions 21 and 22 of the concave curved surface 20 in the blade portion 12 are positioned away from the sputtering target 1. Consequently, the curvature radius of the R face 5 becomes substantially the same as the curvature radius Ra. Gaps d are formed between each of the end portions 21 and 22 of the concave curved surface 20 and the sputtering target 1. The gap d formed between the sputtering target 1 and the end portion 21 of the concave curved surface 20 may differ in size from the gap d formed between the sputtering target 1 and the end portion 22 thereof.

Specifically, a first center point C1 is defined as the center of the concave curved surface 20 with the curvature radius Ra in the blade portion 12 when the corner portion of the sputtering target 1 is chamfered in such as manner that the respective end portions 21 and 22 of the concave curved surface 20 in the blade portion 12 are positioned away from the sputtering target 1. Here, the position of the concave curved surface 20 in the blade portion 12 is indicated by a solid line in FIG. 3.

A center point Cb is defined as the center of curvature of the aimed R face. A second center point C2 is defined as the center of curvature of the concave curved surface 20 with the curvature radius Ra in the blade portion 12 when the sputtering target 1 is chamfered at the corner portion so as to pass the concave curved surface 20 of the blade portion 12 through both ends of the aimed R face. Here, the position of the concave curved surface 20 in the blade portion 12 is indicated by a dotted line in FIG. 3.

Then, the first center point C1 is shifted toward the corner portion side of the sputtering target 1 with respect to the second center point C2.

In a coordinate system with the center point Cb of the aimed R face set as the origin, an intercept L [mm] of the R face is represented by the formula below: $L=Rb-Ra\{1-(Rb-a)^2/Ra^2\}^{1/2}-a$, and satisfies the relationship below: $Rb/2 \leq L \leq Rb$ where a [mm] is a gap of the first center point C1 from the center point Cb of the aimed R face in each of the horizontal and vertical directions on the coordinate system when the second center point C2 is moved to the first center point C1. For example, when Ra=3.5 mm, Rb=3 mm, and a=−0.4 mm, the following values are determined: Rb/2=1.5 mm, L=2.6 mm, and Rb=3 mm. Consequently, the following relationship is satisfied: $Rb/2 \leq L \leq Rb$.

An angle θ [rad] formed between the sputtering surface 2 of the sputtering target 1 and an end portion of the R face 5 of the sputtering target 1 is represented by the formula below: $\theta = \pi/2 - \cos^{-1}\{1-(Rb-a)^2/Ra^2\}^{1/2}$, and satisfies the relationship below: $0 \leq \theta \leq \pi/6$.

For example, when Ra=3.5 mm, Rb=3 mm, and a=−0.4 mm, the following values are determined: θ=0.24 rad, and π/6=0.52. Consequently, the following relationship is satisfied: $0 \leq \theta \leq \pi/6$.

A distance d [mm] between an end portion 22 (corner portion) of the concave curved surface 20 of the blade portion 12 and the sputtering surface 2 of the sputtering target 1 is represented by the formula below: d=Ra−Rb+a, and satisfies the relationship below: 0.05≤d.

For example, when Ra=3.5 mm, Rb=3 mm, and a=−0.4 mm, the following value is determined: d=0.1 mm. Consequently, the following relationship is satisfied: 0.05≤d.

Further, Ra [mm], Rb [mm], a [mm], and the gap b [mm] of the first center point C1 from the second center point C2 satisfy the following relational formula:

$$a=b-Ra \times \sin\{\tfrac{1}{2} \times \sin^{-1}(1-Rb^2/Ra^2)\}.$$

As used herein, the value "a" is a negative value when Cb is set as the origin and C1 is located more on the inner side of the sputtering target than the origin Cb, and a positive value when C1 is located more on the outer side of the sputtering target than Cb. Here, the value "b" is a negative value when C2 is set as the origin and C1 is located more on the inner side of the sputtering target than C2, and a positive value when C1 is located more on the outer side of the sputtering target than the origin C2.

According to the above-mentioned method for processing a sputtering target 1, the sputtering target 1 is chamfered at the corner portion 4 in such a manner that the curvature radius Ra of the concave curved surface 20 of the blade portion 12 is equal to or more than the curvature radius Rb of the aimed R face 105, and preferably more than the curvature radius Rb on the cross section along the axis 11a, and the end portions 21 and 22 of the concave curved surface 20 in the blade portion 12 are positioned away from the sputtering target 1. Thereby, when the sputtering target 1 is cut to chamfer at the corner portion 4 with the concave curved surface 20 of the blade portion 12 so as to form an R face 5, the R face 5 can be approximated to an aimed R face 105 and be prevented from being scratched the R face 5.

According to the above-mentioned method for processing a sputtering target 1, the following relationships are satisfied: Rb/2≤L≤Rb, 0≤θ≤π/6, and 0.05≤d. Thereby, the R face 5 can further be approximated to the aimed R face 105 and be prevented from being scratched to the R face 5.

Furthermore, the following ranges are preferably satisfied: 2Rb/3≤L≤Rb, 0≤θ≤11π/90, and 0.1≤d. Thus, the R face 5 can can further be approximated to the aimed R face 105 and be prevented from being scratched to the R face 5.

In short, the sputtering target 1 can be cut at the corner portion 4 in any region of the concave curved surface 20 excluding the end portions 21 and 22, and the R face 5 can have a smooth surface. In particular, since the R face 5 on the side of the sputtering surface 2 can be prevented from being scratched, abnormal electrical discharge can also be prevented during sputtering, i.e., during applying high voltage between the substrate and the sputtering target 1.

Further, both ends 21 and 22 of the concave curved surface 20 in the blade portion 12 can be prevented from cutting the sputtering target 1 even if the sputtering target 1 is a long body having a length of, for example, 2 m, 3 m, or more to thereby become different in shape among sputtering targets 1. The processing method of the present invention can be applied to processing sputtering targets, including long, rectangle or square targets, disk-shaped targets and cylindrical targets. To exhibit the effects of the present invention, the length in the long-side direction of the sputtering target is 1,500 mm or more and 4,000 mm or less, preferably 2,000 mm or more and 3,500 mm or less, more preferably 2,200 mm or more and 3,200 mm or less, and still more preferably 2,500 mm or more and 2,800 mm or less. In the first embodiment, the cutting tool 10 is arranged with respect to the sputtering target 1 such that the axis 11a coincides with the thickness direction of the sputtering target 1. Alternatively, the cutting tool 10 may be arranged such that the axis 11a is positioned in parallel with the sputtering surface 2, and may be then moved along the long-side direction of the sputtering target 1 (in the extending direction of the corner portion 4), thereby making the blade portion 12 of the cutting tool 10 to cut the corner portion 4 of the sputtering target 1.

Second Embodiment

Figure 4:
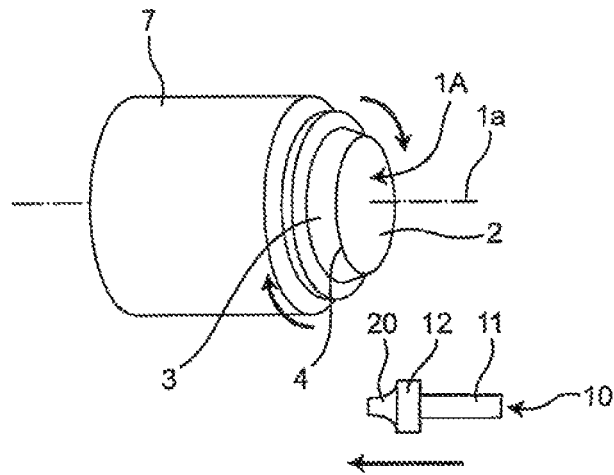
FIG. 4 is a perspective view illustrating a second embodiment of a method for processing a sputtering target according to the present invention.

FIG. 4 is a perspective view illustrating a second embodiment of a method for processing a sputtering target according to the present invention. In the second embodiment, the same reference numerals as those in the first embodiment denote the same components as those in the first embodiment, and thus their descriptions are omitted.

In the first embodiment, the processing device, such as a milling machine, an NC milling machine, or a machining center, has been described by way of example. In this processing device, the sputtering target is chamfered at the corner portion by rotating the cutting tool while fixing the sputtering target. In the second embodiment, the sputtering target is chamfered at the corner portion by rotating a disk-shaped or cylindrical sputtering target around its central axis without rotating a blade portion of the cutting tool.

As shown in FIG. 4, a disk-shaped sputtering target 1A is attached onto a rotating portion 7 of the processing device, and then the rotating portion 7 is rotated to make the sputtering target 1A rotate around the central axis 1a. The central axis 1a of the sputtering target 1A is a straight line that intersects the sputtering surface 2 perpendicularly and passes through the center of the sputtering surface 2. As the processing device for chamfering, a lathe, an NC lathe, and the like can be used.

Thereafter, the sputtering target 1A as rotating is chamfered at the corner portion 4 between the sputtering surface 2 and side surface 3 with the concave curved surface 20 of the blade portion 12 in the cutting tool 10 in such a manner that the cornea portion is approximated to the aimed R face. A specific chamfering method in the present embodiment is the same as that in the first embodiment. The blade portion 12 in the cutting tool 10 can have the same shape as the cutting tool used in the processing device of the first embodiment, such as a milling machine.

When the sputtering target 1A has a disk shape, the use of the processing device, such as a lathe or an NC lathe, the sputtering target 1A can be processed efficiently and be prevented from being scratched.

The number of rotations around the central axis 1a for the sputtering target 1A and the feed speed of the blade portion for the cutting tool 10 during chamfering may be appropriately adjusted depending on the material of the sputtering target 1A. Usually, the number of rotations may be 5 to 1000 rpm, and the tool feed speed may be 1 mm/rotation or less.

The cylindrical sputtering target can also be processed in the same manner as the disk-shaped sputtering target. That is, the sputtering target is rotated around its central axis to be chamfered at the corner portion with a cutting tool. In the cylindrical sputtering target, the sputtering surface is formed by an outer peripheral surface of a cylindrical material. Each of the side surfaces is formed by a surface in the thickness direction of the cylindrical material. The central axis of the cylindrical target is a straight line that is in parallel with the outer peripheral surface and passes through the center of the side surface.

When chamfering the disk-shaped or cylindrical sputtering target, the cutting tool can be approached and contacted by setting the shaft portion of the cutting tool perpendicular to the sputtering surface or to the side surface in the sputtering target. It may be appropriately selected depending on the shape of the sputtering target and the type of the processing device.

Third Embodiment

A method for producing a sputtering target product will be described. A sputtering target is processed by the method for processing a sputtering target according to the first embodiment or the second embodiment to produce a sputtering target product.

Specifically, for example, in the producing method, a target material is formed into a rectangular parallelepiped shape or a cylindrical shape through melting or casting. Then, the formed target material is subjected to plastic working, such as rolling, forging, or extrusion, thereby obtaining a plate-shaped or cylindrical sputtering target. Thereafter, the thus-obtained sputtering target is processed by the processing method. The processed plate-shaped sputtering target is joined to a backing plate to produce a sputtering target product.

The surface of the sputtering target obtained after the processing by the processing method and/or after the joining to the backing plate may be subjected to finish processing as needed. The backing plate may be omitted, and only the processed sputtering target may be used to produce the sputtering target product. The joined sputtering target may be processed by the method for processing a sputtering target, thereby producing the sputtering target product. In the case of the cylindrical sputtering target, an adapter for installation on a dedicated device may be welded and attached to either one or both of the end portions of the sputtering target.

The backing plate is made of a conductive material, such as a metal or an alloy thereof. Examples of the metal include copper, aluminum and titanium. For example, solder is used to join the sputtering target and the backing plate. Examples of the material of the solder include metals, such as indium, tin, zinc and lead, and alloys thereof.

Therefore, the method for producing a sputtering target product utilizes the processing method so that the sputtering target product having improved quality can be provided.

The present invention is not limited to the above-mentioned embodiments, and various modifications and changes can be made to these embodiments without departing from the scope of the present invention.

Example 1

Example 1 is shown in Table 1. Table 1 shows the relationship among the intercept L [mm], the angle θ [rad] of the R face 5, and the gap d [mm] when changing the radius Ra [mm] of the cutting tool 10, the gap a [mm] of the first center point C1 from the center point Cb of the aimed R face, the gap b [mm] of the first center point C1 from the second center point C2. Here, the value "b" was a negative value when C2 was set as the origin and C1 was located more on the inner side of the sputtering target than C2, and a positive value when C1 was located more on the outer side of the sputtering target than the origin C2.

TABLE 1

| Radius of end mill Ra [mm] | Gap a [mm] of first center point C1 from center point Cb of aimed R face | Gap b [mm] of first center point C1 from second center point C2 | Intercept L [mm] | Angle θ relative to sputtering surface [rad] | Distance d between end portion of blade portion and sputtering surface [mm] |
|---|---|---|---|---|---|
| 3 | 0 | 0 | 3.0 | 0.00 | 0.00 |
|  | 0.1 | 0.1 | 2.1 | 0.26 | 0.10 |
|  | 0.2 | 0.2 | 1.7 | 0.37 | 0.20 |
|  | 0.3 | 0.3 | 1.4 | 0.45 | 0.30 |
|  | 0.4 | 0.4 | 1.1 | 0.52 | 0.40 |
|  | 0.5 | 0.5 | 0.8 | 0.59 | 0.50 |
| 3.25 | −0.241 | 0 | 3.0 | 0.07 | 0.01 |
|  | −0.141 | 0.1 | 2.3 | 0.26 | 0.11 |
|  | −0.041 | 0.2 | 1.9 | 0.36 | 0.21 |
|  | 0.059 | 0.3 | 1.6 | 0.44 | 0.31 |
|  | 0.159 | 0.4 | 1.3 | 0.51 | 0.41 |
|  | 0.259 | 0.5 | 1.0 | 0.57 | 0.51 |
| 3.5 | −0.469 | 0 | 3.0 | 0.13 | 0.03 |
|  | −0.369 | 0.1 | 2.4 | 0.27 | 0.13 |
|  | −0.269 | 0.2 | 2.0 | 0.37 | 0.23 |
|  | −0.169 | 0.3 | 1.7 | 0.44 | 0.33 |
|  | −0.069 | 0.4 | 1.4 | 0.50 | 0.43 |
|  | 0.031 | 0.5 | 1.1 | 0.56 | 0.53 |
| 3.75 | −0.687 | 0 | 3.0 | 0.18 | 0.06 |
|  | −0.587 | 0.1 | 2.5 | 0.30 | 0.16 |
|  | −0.487 | 0.2 | 2.1 | 0.38 | 0.26 |
|  | −0.387 | 0.3 | 1.8 | 0.44 | 0.36 |
|  | −0.287 | 0.4 | 1.5 | 0.50 | 0.46 |
|  | −0.187 | 0.5 | 1.2 | 0.56 | 0.56 |
| 4 | −0.898 | 0 | 3.0 | 0.23 | 0.10 |
|  | −0.798 | 0.1 | 2.5 | 0.32 | 0.20 |
|  | −0.698 | 0.2 | 2.2 | 0.39 | 0.30 |
|  | −0.598 | 0.3 | 1.9 | 0.45 | 0.40 |
|  | −0.498 | 0.4 | 1.6 | 0.51 | 0.50 |
|  | −0.398 | 0.5 | 1.3 | 0.56 | 0.60 |
| 4.25 | −1.104 | 0 | 3.0 | 0.26 | 0.15 |
|  | −1.004 | 0.1 | 2.6 | 0.34 | 0.25 |
|  | −0.904 | 0.2 | 2.2 | 0.41 | 0.35 |
|  | −0.804 | 0.3 | 1.9 | 0.46 | 0.45 |
|  | −0.704 | 0.4 | 1.6 | 0.51 | 0.55 |
|  | −0.604 | 0.5 | 1.4 | 0.56 | 0.65 |
| 4.5 | −1.306 | 0 | 3.0 | 0.29 | 0.19 |
|  | −1.206 | 0.1 | 2.6 | 0.36 | 0.29 |
|  | −1.106 | 0.2 | 2.3 | 0.42 | 0.39 |
|  | −1.006 | 0.3 | 2.0 | 0.47 | 0.49 |
|  | −0.906 | 0.4 | 1.7 | 0.52 | 0.59 |
|  | −0.806 | 0.5 | 1.4 | 0.56 | 0.69 |

Ra was changed to 3 mm, 3.25 mm, 3.5 mm, 3.75 mm, 4 mm, 4.25 mm, and 4.5 mm. Rb was set to 3 mm. In addition, b was changed to 0 mm, 0.1 mm, 0.2 mm, and 0.3 mm with the second center point C2 used as the reference in each Ra.

Figure 5:
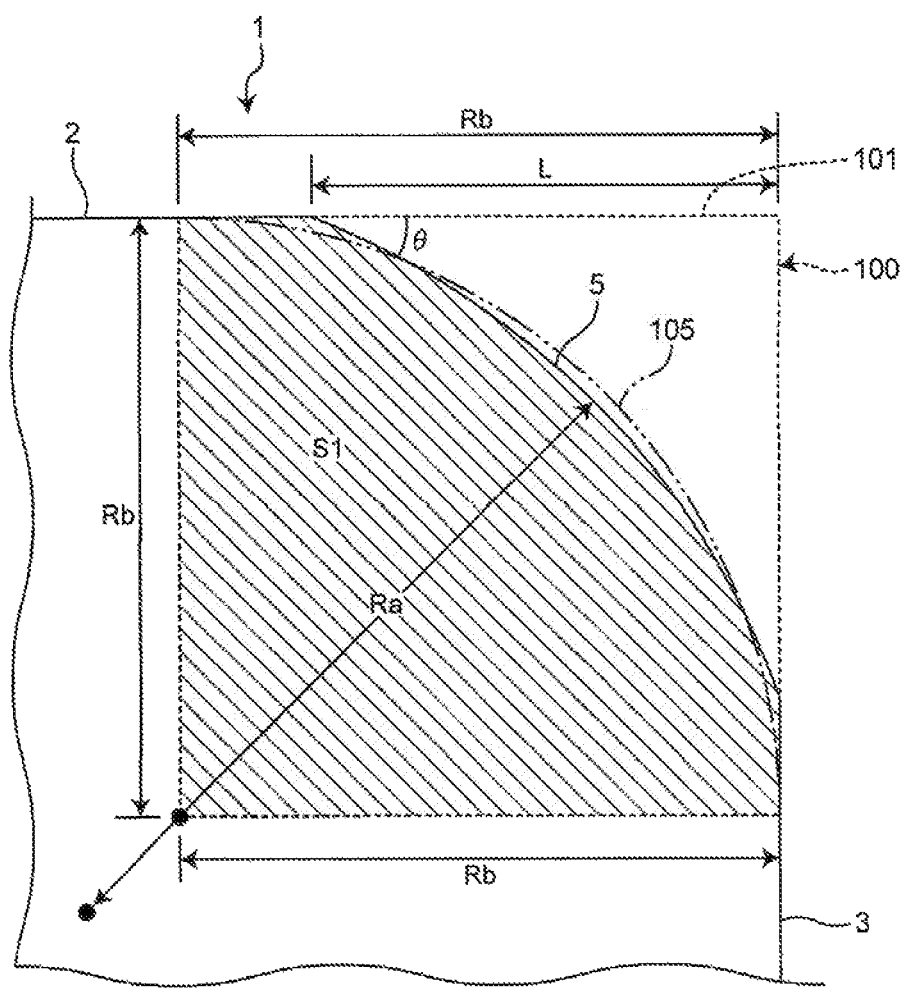
FIG. 5 is an enlarged view illustrating the sputtering target.

The intercept L, the angle θ of the R face, and the gap d will be described with reference to an enlarged view of the sputtering target 1 in FIG. 5.

The aimed R face 105 is indicated by a dashed-two dotted line. A square 100 with one side Rb is defined such that an arc line of the aimed R face 105 intersects with the vertices of the diagonal line of the square 100. This square 100 is indicated by a dotted line. The first side 101 of the four sides of the square 100, which is located outside the sputtering target 1, contacts the sputtering surface 2.

The intercept L and the angle θ will be described below. The intercept L is defined as a length of a part of the first side 101 located outside the R face 5. The angle θ of the R face is defined as an angle formed between a line as a part of the first side 101 located outside the R face 5 and the R face 5.

The gap d will be described below. As shown in FIG. 3, the gap d is defined as a distance between each of both ends 21 and 22 of the concave curved surface 20 and the sputtering target 1.

FIGS. 6 to 8 are made based on Table 1. FIG. 6 shows the relationship between Ra and b and the intercept L; FIG. 7 shows the relationship between Ra and b and the angle θ of the R face; and FIG. 8 shows the relationship between Ra and b and the gap d.

In FIGS. 6 to 8, the ranges enclosed by frames indicate ranges in which the R face 5 could approach the aimed R face 105 while securing the distance between each of the end portions 21 and 22 of the concave curved surface 20 and the sputtering target 1.

Specifically, in FIGS. 6 and 7, the ranges enclosed by solid lines indicate ranges of L and θ specified by the embodiment of the present application, respectively, and the ranges enclosed by dashed-dotted lines indicate preferable ranges of L and θ, respectively.

In FIG. 8, the range enclosed by the solid line indicates the range of d specified by the embodiment of the present application, and the range enclosed by the dashed-dotted line indicates a preferable range of d. Furthermore, the range enclosed by the dashed-two dotted line indicates a range where all the specified ranges of d, θ and L overlap one another, and the range enclosed by the dotted line indicates a range where all the preferable ranges of d, θ and L overlap one another.

As shown in FIG. 8, when Ra=3 and b=0, the distance d resulted in d=0.00. Here, both ends 21 and 22 of the concave curved surface 20 in the blade portion 12 were in contact with the sputtering target 1, but it was found that the end portions 21 and 22 of the concave curved surface 20 in the blade portion 12 cut into the sputtering target 1 due to slight variations during the processing treatment, such as distortion of the material of the sputtering target 1 or runout of the blade portion 12, resulting in scratching the sputtering target 1 with a very high possibility. It was supposed that when the distance d was set to 0.05 or more, the end portions 21 and 22 of the blade portion 12 was suppressed to contact or cut and scratch the sputtering target 1, even if the distortion of the material or runout of the blade portion 12 occurs.

As shown in Table 1 and FIGS. 6 to 8, when the following relationships were satisfied: Rb/2≤L≤Rb, 0≤θ≤π/6, and 0.05≤d, the R face 5 could be approximated to an aimed R face 105 and could easily be prevented from being scratched.

Example 2

In Example 2, the values Ra and Rb were different from those in Example 1. Specifically, in Example 2, the sputtering target was processed on the same conditions as those in Example 1 except that Ra was changed to 2 mm, 2.25 mm, 2.5 mm, 2.75 mm, 3 mm, 3.25 mm, and 3.5 mm. Rb was set at 2 mm.

FIG. 9 shows the relationship between Ra and b and the intercept L; FIG. 10 shows the relationship between Ra and b and the angle θ of the R face; and FIG. 11 shows the relationship between Ra and b and the gap d.

As shown in FIGS. 9 to 11, when the following relationships were satisfied: Rb/2≤L≤Rb, 0≤θ≤π/6, and 0.05≤d, the R face 5 could be approximated to an aimed R face 105 and could easily be prevented from be scratched.

Specifically, in FIGS. 9 and 10, the ranges enclosed by the solid lines indicate ranges of L and θ specified by the embodiment of the present application, respectively, and the ranges enclosed by the dashed-dotted lines indicate preferable ranges of L and θ, respectively.

In FIG. 11, the range enclosed by the solid line indicates the range of d specified by the embodiment of the present application, and the range enclosed by the dashed-dotted line indicates a preferable range of d. Furthermore, the range enclosed by the dashed-two dotted line indicates a range where all the specified ranges of d, θ and L overlap one another, and the range enclosed by the dotted line indicates a range where all the preferable ranges of d, θ and L overlap one another.

Example 3

In Example 3, the sputtering target was processed on the same conditions as those in Example 1 except that the values Ra and Rb were different. Ra was changed to 4 mm, 4.25 mm, 4.5 mm, 4.75 mm, 5 mm, 5.25 mm, and 5.5 mm. Rb was set at 4 mm.

FIG. 12 shows the relationship between Ra and b and the intercept L; FIG. 13 shows the relationship between Ra and b and the angle θ of the R face; and FIG. 14 shows the relationship between Ra and b and the gap d.

As shown in FIGS. 12 to 14, when the following relationships were satisfied: Rb/2≤L≤Rb, 0≤θ≤π/6, and 0.05≤d, the R face 5 could be approximated to an aimed R face 105 and could easily be prevented from be scratched.

Specifically, in FIGS. 12 and 13, the ranges enclosed by the solid lines indicate ranges of L and θ specified by the embodiment of the present application, respectively, and the ranges enclosed by the dashed-dotted lines indicate preferable ranges of L and θ, respectively.

In FIG. 14, the range enclosed by the solid line indicates the range of d specified by the embodiment of the present application, and the range enclosed by the dashed-dotted line indicates a preferable range of d. Furthermore, the range enclosed by the dashed-two dotted line indicates a range where all the specified ranges of d, θ and L overlap one another, and the range enclosed by the dotted line indicates a range where all the preferable ranges of d, θ and L overlap one another.

(Experiment)

Next, experimental data about Examples of the present application will be described. A rolled plate made of high-purity Al, which had a purity of 99.999%, was prepared. Cutting processing was performed on the rolled plate by installing a cutter for surface processing and an end mill for side surface processing on a double column type machining center, thereby obtaining a sputtering target material having a long side of 2300 mm in length and a short side of 190 mm in length. Then, a cutting tool (R cutter) for R processing was fixed to the double column type machining center, and subsequently a corner portion of the sputtering target material was processed by the cutting tool under the processing conditions including the number of rotations of 8000 rpm and the tool feed speed of 1000 mm/min, whereby a sputtering target was finally obtained. Here, when the processing was performed on the corner portion by setting Ra=3.25, Rb=3, and a=0.009 (b=0.25), a defect rate of scratching the sputtering target by the end portion of the blade was 0%. When the processing was performed on the corner portion by setting Ra=3.5, Rb=3, and a=−0.369 (b=0.1), a defect rate of scratching the sputtering target by the end portion of the blade was 0%.

DESCRIPTION OF REFERENCE NUMERALS 1, 1A Sputtering target
1a Central axis
2 Sputtering surface
3 Side surface
4 Corner portion
5 R face
10 Cutting tool
11 Shaft portion
11a Axis
12 Blade portion
20 Concave curved surface
21 First end
22 Second end
30 Side surface
31 Leading end surface
105 Aimed R face
C1 First center point
C2 Second center point
Cb Center of aimed R face
d Gap between each of both ends of the concave curved surface and the sputtering target
Ra Curvature radius of the concave curved surface in the blade portion in the cutting tool
Rb Curvature radius of the aimed R face of the sputtering target

The invention claimed is:

1. A method for processing a sputtering target comprising:
processing a sputtering target by rotating a cutting tool which has a blade portion with an arc-shaped concave curved surface on a cross section along an axis, around the axis thereof, to chamfer the target at a corner portion between a sputtering surface and a side surface in the sputtering target with the arc-shaped concave curved surface of the blade portion in such a manner that the corner portion gets approximated to an arc-shaped aimed R face, wherein the sputtering target is chamfered at the corner portion in such a manner that both ends of the concave curved surface of the blade portion are positioned away from the sputtering target, and wherein, in a coordinate system in which a center point Cb of the aimed R face with the curvature radius Rb is set as an origin, a [mm] is a gap of a first center point C1 of the concave curved surface with the curvature radius Ra of the blade portion from the center point Cb in each of horizontal and vertical directions on the coordinate system, Ra, Rb, and a are set to satisfy the following conditions:

with regard to an intercept L [mm] of an R face, the relationship of $Rb/2 \leq L \leq Rb$ is satisfied when L is represented by the formula of $L=Rb-Ra\{1-(Rb-a)^2/Ra^2\}^{1/2}-a$;

with regard to an angle θ [rad] formed between the sputtering surface of the sputtering target and an end portion of the R face of the sputtering target, the relationship of $0 \leq \theta \leq \pi/6$ is satisfied when the angle θ [rad] is represented by the formula of $\theta=\pi/2-\cos^{-1}\{1-(Rb-a)^2/Ra^2\}^{1/2}$; and with regard to a distance d [mm] between an end portion of the concave curved surface of the blade portion and the sputtering surface of the sputtering target, the relationship of $0.05 \leq d$ is satisfied when the distance d [mm] is represented by the formula of $d=Ra-Rb+a$.

2. A method for processing a sputtering target, comprising: processing a disk-shaped or cylindrical sputtering target by rotating the target around a central axis thereof to chamfer the target at a corner portion between a sputtering surface and a side surface in the rotating sputtering target with an arc-shaped concave curved surface of a blade portion in such a manner that the corner portion gets approximated to an arc-shaped aimed R face, wherein the corner portion of the sputtering target is chamfered in such a manner that both ends of the concave curved surface of the blade portion were positioned away from the sputtering target, and wherein, in a coordinate system in which a center point Cb of the aimed R face with the curvature radius Rb is set as an origin, a [mm] is a gap of a first center point C1 of the concave curved surface with the curvature radius Ra of the blade portion from the center point Cb in each of horizontal and vertical directions on the coordinate system, Ra, Rb, and a are set to satisfy the following conditions:

with regard to an intercept L [mm] of an R face, the relationship of $Rb/2 \leq L \leq Rb$ is satisfied when L is represented by the formula of $L=Rb-Ra\{1-(Rb-a)^2/Ra^2\}^{1/2}-a$;

with regard to an angle θ [rad] formed between the sputtering surface of the sputtering target and an end portion of the R face of the sputtering target, the relationship of $0 \leq \theta \leq \pi/6$ is satisfied when the angle θ [rad] is represented by the formula of $\theta=\pi/2-\cos^{-1}\{1-(Rb-a)^2/Ra^2\}^{1/2}$; and with regard to a distance d [mm] between an end portion of the concave curved surface of the blade portion and the sputtering surface of the sputtering target, the relationship of $0.05 \leq d$ is satisfied when the distance d [mm] is represented by the formula of $d=Ra-Rb+a$.

3. A method for producing a sputtering target product, comprising: processing a sputtering target using the method according to claim 1 to producing the sputtering target product.

4. A method for producing a sputtering target product, comprising: processing a sputtering target using the method according to claim 2 to producing the sputtering target product.

* * * * *